US008828560B2

(12) United States Patent
Yersin et al.

(10) Patent No.: US 8,828,560 B2
(45) Date of Patent: Sep. 9, 2014

(54) BIPHENYL-METAL COMPLEXES—MONOMERIC AND OLIGOMERIC TRIPLET EMITTERS FOR OLED APPLICATIONS

(75) Inventors: Hartmut Yersin, Sinzing (DE); Uwe Monkowius, Linz (AU); Rafal Czerwieniec, Regensburg (DE)

(73) Assignee: Merck Patent GmbH, Darmstadt (DE)

( * ) Notice: Subject to any disclaimer, the term of this patent is extended or adjusted under 35 U.S.C. 154(b) by 0 days.

(21) Appl. No.: 13/540,219

(22) Filed: Jul. 2, 2012

(65) Prior Publication Data
US 2013/0020560 A1  Jan. 24, 2013

Related U.S. Application Data

(62) Division of application No. 12/297,010, filed as application No. PCT/EP2007/003261 on Apr. 12, 2007, now abandoned.

(30) Foreign Application Priority Data

Apr. 13, 2006 (DE) .................. 10 2006 017 485

(51) Int. Cl.
*H01L 51/54* (2006.01)
*C09K 11/06* (2006.01)
*H01L 51/00* (2006.01)
*H01L 51/50* (2006.01)

(52) U.S. Cl.
CPC ........ *H01L 51/0087* (2013.01); *H01L 51/0043* (2013.01); *H01L 51/5016* (2013.01); *H01L 51/0035* (2013.01); *H01L 51/0084* (2013.01); *H01L 51/0085* (2013.01); *H01L 51/004* (2013.01); *Y10S 428/917* (2013.01)
USPC ............ 428/690; 428/917; 313/504; 257/40; 257/E51.044; 427/66

(58) Field of Classification Search
None
See application file for complete search history.

(56) References Cited

U.S. PATENT DOCUMENTS

| | | | |
|---|---|---|---|
| 6,097,147 A | 8/2000 | Baldo et al. | |
| 2002/0034656 A1 | 3/2002 | Thompson et al. | |
| 2002/0068190 A1 | 6/2002 | Tsuboyama et al. | |
| 2004/0026663 A1 | 2/2004 | Heuer et al. | |
| 2005/0031904 A1 | 2/2005 | Igarashi et al. | |
| 2005/0137400 A1 | 6/2005 | Tao et al. | |
| 2005/0211974 A1* | 9/2005 | Thompson et al. | ............. 257/40 |
| 2005/0260449 A1 | 11/2005 | Walters et al. | |
| 2006/0073358 A1 | 4/2006 | Lyu et al. | |
| 2007/0111025 A1* | 5/2007 | Lennartz et al. | .............. 428/690 |
| 2007/0191587 A1 | 8/2007 | Kanitz et al. | |

FOREIGN PATENT DOCUMENTS

| | | | |
|---|---|---|---|
| CN | 1350768 | A | 5/2002 |
| DE | 10361385 | A1 | 10/2005 |
| EP | 1191614 | A2 | 3/2002 |
| JP | 2002175884 | A | 6/2002 |
| WO | WO-00/57676 | A1 | 9/2000 |
| WO | WO-03/087258 | A1 | 10/2003 |
| WO | WO 2005/056712 | A1 * | 6/2005 |
| WO | WO-2005/098988 | A1 | 10/2005 |

OTHER PUBLICATIONS

Y. Chen et al., "Crystal structure . . . a platinum (II) complex coordinated to the biphenyl dianion and cyclooctadiene", Journal of Chemical Crystallography, vol. 26, No. 8, pp. 527-531 (1996).
B. L. Edelbach et al., "Catalytic hydrogenolysis of biphenylene with platinum, palladium, and nickel phosphine complexes", Organometallics, vol. 17, No. 22, pp. 4784-4794, 1998.
J. DePriest et al., "Structure Platinum (II) complexes containing bidentate aromatic and bis(diphenylphosphino)methane as ligands", Inorg. Chem., vol. 39, No. 9, pp. 1955-1963, 2000.
C. N. Iverson et al., "n2-Coordination and C-H Activation of Electron-Poor Arenes", Organometallics, vol. 21, No. 23, pp. 5320-5333 (2002).

* cited by examiner

*Primary Examiner* — Marie R. Yamnitzky
(74) *Attorney, Agent, or Firm* — Drinker Biddle & Reath LLP

(57) ABSTRACT

The present invention relates to light-emitting devices and novel emitter materials as well as emitter systems and, in particular, organic light-emitting devices (OLEDs). In particular, the invention relates to the use of luminescent complexes as emitters in such devices.

31 Claims, 8 Drawing Sheets

Figure 1A

| | |
|---|---|
| Cathode: Al | 200 nm |
| Interlayer: LiF | 0,8 nm |
| Electron-conducting layer ETL: Alq$_3$ | 40 nm |
| Emitter layer EML: UGH with doping | 30 nm |
| Hole-transport layer HTL: α-NPD | 30 nm |
| Hole-injection layer HIL: CuPc | 10 nm |
| Anode ITO | 40 nm |
| Support material glass | |

Figure 1B

| 9 | Cathode |
|---|---|
| 8 | Interlayer |
| 7 | ETL |
| 6 | Hole-blocking layer |
| 5 | Emitter layer |
| 4 | Electron-blocking layer |
| 3 | HTL |
| 2 | Anode, ITO |
| 1 | Support material, glass |

Figure 2

| 7 | Cathode, Al: 60 nm |
| 6 | Interlayer CsF: 0.8 nm |
| 5 | ETL, Alq$_3$: 40 nm |
| 4 | Emitter layer: 10 to 80 nm |
| 3 | HTL, PEDOT: PSS: 50 nm |
| 2 | Anode, ITO: 40 nm |
| 1 | Support material, glass |

Emission spectrum of (bph)Pt(COD) as solid and in solution (methylTHF).

Emission spectrum of (bph)Pt(dppe)
(dppe = (bis(diphenylphosphino)ethane) as the solid and in solution (methylTHF).

Emission of a vacuum-sublimed layer of (bph)Pt(CO)₂ at 300 K.

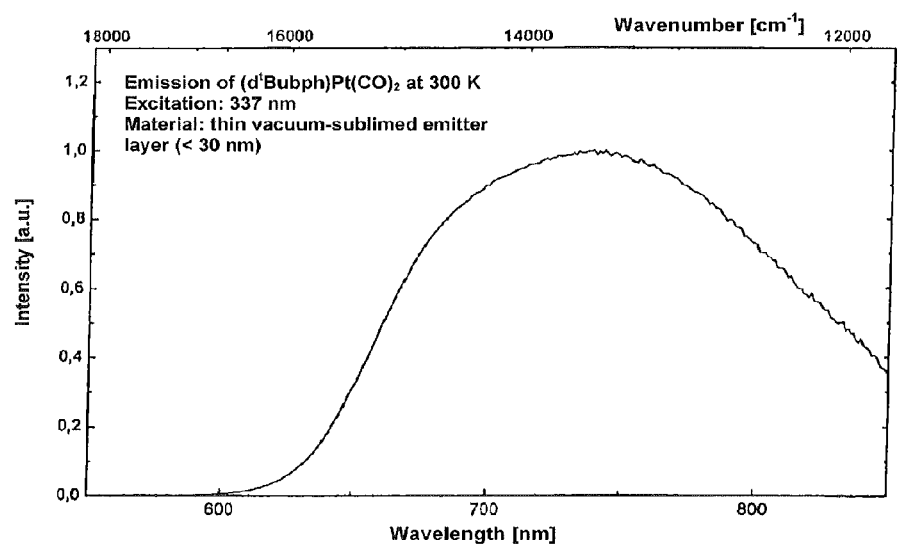
Figure 6: Emission of a vacuum-sublimed layer of $(d^tBubph)Pt(CO)_2$ at 300 K.

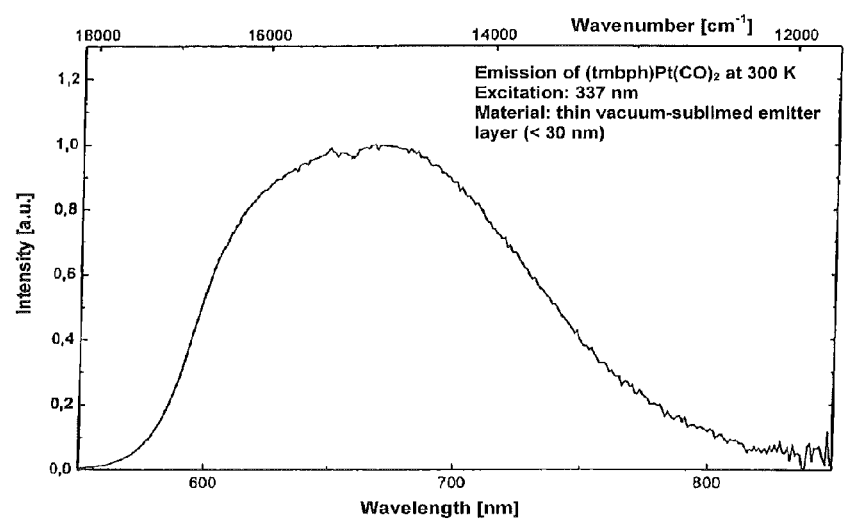
Figure 7: Emission of a vacuum-sublimed layer of (tmbph)Pt(CO)$_2$ at 300 K.

BIPHENYL-METAL COMPLEXES—MONOMERIC AND OLIGOMERIC TRIPLET EMITTERS FOR OLED APPLICATIONS

CROSS-REFERENCE TO RELATED APPLICATIONS

This application is a divisional application of application Ser. No. 12/297,010 filed Jan. 22, 2009 (now abandoned). Application Ser. No. 12/297,010 is a national stage application (under 35 U.S.C. §371) of PCT/EP2007/003261, filed Apr. 12, 2007, which claims benefit of German application 10 2006 017485.2, filed Apr. 13, 2006.

BACKGROUND OF THE INVENTION

Description

The present invention relates to light-emitting devices and, in particular, organic light-emitting devices (OLEDs). In particular, the invention relates to the use of luminescent biphenyl-metal complexes as monomer and oligomer emitters in such devices.

OLEDs (organic light-emitting devices or organic light-emitting diodes) represent a novel technology which will dramatically change display-screen and illumination technology. OLEDs predominantly consist of organic layers, which are also flexible and inexpensive to manufacture. OLED components can have a large-area design as illumination elements, but also a small design as pixels for displays.

A review of the function of OLEDs is given, for example, in H. Yersin, Top. Curr. Chem. 2004, 241, 1.

Since the first reports on OLEDs (see, for example, Tang et al., Appl. Phys. Lett. 51 (1987) 913), these devices have been developed further, in particular with respect to the emitter materials employed, where, in particular, so-called triplet or phosphorescent emitters are of interest.

Compared with conventional technologies, such as, for example, liquid-crystal displays (LCDs), plasma displays or cathode-ray tubes (CRTs), OLEDs have numerous advantages, such as, for example, a low operating voltage, a thin structure, pixels which self-illuminate with high efficiency, high contrast and good resolution as well as the possibility to display all colours. Furthermore, an OLED emits light on application of an electrical voltage instead of only modulating it. Whereas numerous applications have already been developed for OLEDs and novel areas of application have also been opened up, there is still a demand for improved OLEDs and in particular for improved triplet emitter materials. In the solutions to date, problems arise, in particular, with the long-term stability, the thermal stability and the chemical stability to water and oxygen. Furthermore, many emitters exhibit only low sublimation ability. Furthermore, important emission colours are frequently unavailable with emitter materials known to date. High efficiencies frequently also cannot be achieved at high current densities or high luminous densities. Finally, problems exist with respect to manufacturing reproducibility in the case of many emitter materials.

WO 03/087258 describes OLEDs comprising organometallic compounds which are, in particular, pentacoordinated complexes with 16 valence electrons or hexacoordinated complexes with 18 valence electrons. Likewise, EP 1 191 614 A2, US2002/0034656 A1 and WO 00/57676 A1 describe platinum compounds which contain both a biphenyl group and also a bipyridine group as ligands.

BRIEF SUMMARY OF THE INVENTION

It was an object of the present invention to provide novel emitter materials, in particular for OLEDs and novel light-emitting devices, which overcome at least some of the disadvantages of the prior art and which have, in particular, high chemical stability.

This object is achieved in accordance with the invention by a light-emitting device comprising (i) an anode, (ii) a cathode and (iii) an emitter layer arranged between and in direct or indirect contact with the anode and the cathode, comprising at least one complex of the formula (I)

in which
M represents Pt(II), Rh(I), Ir(I), Pd(II) or Au(III), in particular Pt(II),
L represents a bidentate ligand or
L=X$_2$, where each X, independently, represents a monodentate ligand, and s-bph represents a ligand which has an Ar—Ar group, where Ar represents an aromatic ring system, for example, in particular, biphenyl or substituted biphenyl.

Surprisingly, it has been found that the use according to the invention of the complexes of the formula (I) in the emitter layer enables light-emitting devices which have excellent properties to be obtained. In particular, the compounds employed in accordance with the invention exhibit high quantum yields. In addition, the complexes can be varied by substitution or/and changing of the ligands, giving rise to a wide variety of possibilities for modification or control of the emission properties. In addition, a suitable choice of the ligands enables compounds having high sublimation ability to be obtained.

BRIEF DESCRIPTION OF THE FIGURES

FIG. 1A illustrates an example of an OLED device comprising complexes according to the invention which can be produced by means of the vacuum sublimation technique.

FIG. 1B illustrates an example of a differentiated, high-efficiency OLED device comprising sublimable emitter materials according to the invention.

FIG. 2 is an example of an OLED device for emitters according to the invention which are to be applied by wet-chemical methods. The layerthickness data should be regarded as illustrative values.

FIG. 6 is the emission of a vacuum-sublimed layer of (d$^t$Bubph)Pt(CO)$_2$ at 300 K.

FIG. 7 is the emission of a vacuum-sublimed layer of (tmbph)Pt(CO)$_2$ at 300 K.

DETAILED DESCRIPTION OF THE INVENTION

Figure 3:
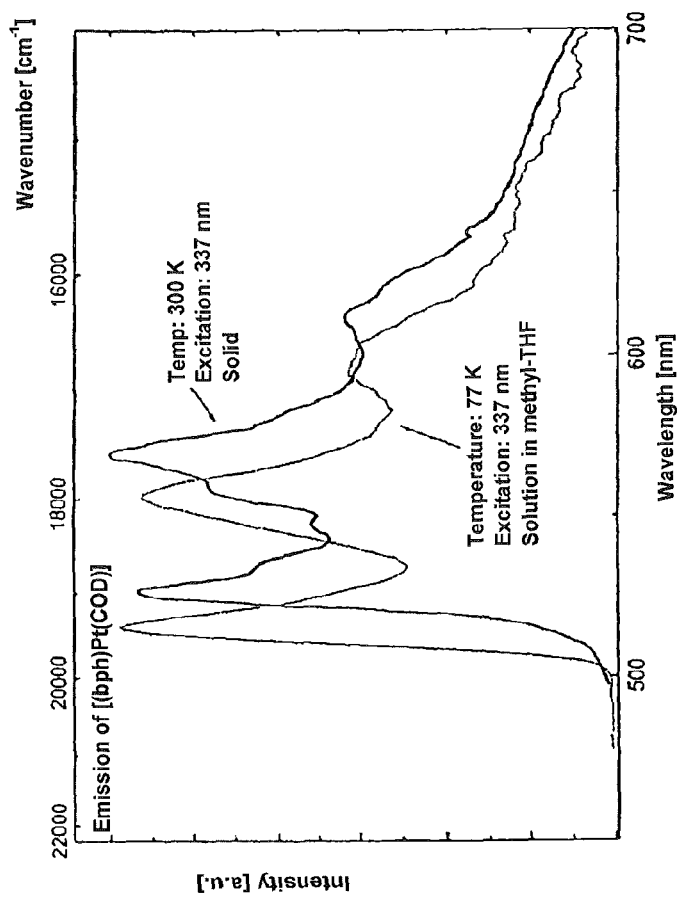
FIG. 3 is the emission spectrum of (bph)Pt(COD) as solid and in solution (methylTHF).

The way in which an embodiment of the light-emitting devices according to the invention functions is shown diagrammatically in FIG. 1A. The device comprises at least an anode, a cathode and an emitter layer. One or both of the electrodes used as cathode or anode advantageously has a transparent design, enabling the light to be emitted through this electrode. The transparent electrode material used is preferably indium tin oxide (ITO). A transparent anode is particularly preferably employed. The other electrode can likewise be made of a transparent material, but may also be formed from another material having a suitable electron work function if light is only to be emitted through one of the two electrodes. The second electrode, in particular the cathode, preferably consists of a metal of high electrical conductivity, for example aluminium or silver, or an Mg/Ag or Ca/Ag alloy. An emitter layer is arranged between the two electrodes. This can be in direct contact or indirect contact with the anode and cathode, where indirect contact means that further layers are present between the cathode or anode and the emitter layer, so that the emitter layer and the anode or/and cathode do not touch one another, but instead are in electrical contact with one another via further interlayers. On application of a voltage, for example a voltage of 2-20 V, in particular 5-10 V, negatively charged electrons are emitted from the cathode, for example a conductive metal layer, particularly preferably from an aluminium cathode, and migrate in the direction of the positive anode. Positive charge carriers, so-called holes, in turn migrate from this anode in the direction of the cathode. In accordance with the invention, the emitter layer arranged between the cathode and anode comprises organometallic complexes of the formula (I) as emitter molecules. The migrating charge carriers, i.e. a negatively charged electron and a positively charged hole, recombine at the emitter molecules or in their vicinity and result in neutral, but energetically excited states of the emitter molecules. The excited states of the emitter molecules then release the energy as light emission.

The light-emitting devices according to the invention can be produced by vacuum deposition so long as the emitter materials are sublimable. Alternatively, construction via wet-chemical application is also possible, for example via spin-coating methods, via ink-jet printing or via screen-printing methods. The structure of OLED devices is described in detail, for example, in US2005/0260449 A1 and in WO 2005/098988 A1.

The light-emitting devices according to the invention can be manufactured by means of the vacuum sublimation technique and comprise a plurality of further layers, in particular an electron-injection layer and an electron-conduction layer (for example $Alq_3$=Al 8-hydroxyquinoline or $\beta$-Alq=Al bis (2-methyl-8-hydroxyquinolato)-4-phenylphenolate) and/or a hole-injection (for example CuPc) and hole-conduction layer or hole-conduction layer (for example $\alpha$-NPD). However, it is also possible for the emitter layer to take on functions of the hole- or electron-conduction layer.

The emitter layer preferably consists of an organic matrix material having a sufficiently large singlet $S_0$-triplet $T_1$ energy gap (UGH matrix material), for example comprising UGH, PVK (polyvinylcarbazole), CBP (4,4'-bis(9-carbazolyl)biphenyl) or other matrix materials. The emitter complex is doped into this matrix material, for example preferably to the extent of 1 to 10 percent by weight. The HOMO and LUMO energy values, which are important for the selection of matrix materials in OLED devices, of some selected biphenylPt(II) complexes are shown in Table 2.

TABLE 2

Electrochemical data of some selected biphenyl-Pt(II) complexes

| Ligand | $E_{red}$ [V] | $E_{ox}$ [V] | HOMO[d] [eV] | LUMO[d] [eV] |
|---|---|---|---|---|
| CO | $-1.08^{a,b}$ | $1.10^{a,b}$ | $-5.9$ | $-3.7$ |
| $Et_2S$ | $-1.14^c$ | $1.35^{a,c}$ | $-6.0$ | $-3.7$ |
| py | $-1.85^c$ | $0.81^{a,c}$ | $-5.5$ | $-3.1$ |
| MeCN | $-1.67^c$ | $0.85^{a,c}$ | $-5.5$ | $-3.3$ |
| en | $-1.71^c$ | $0.67^{a,c}$ | $-5.3$ | $-3.2$ |
| bpy | $-1.47^c$ | $0.07^{a,c}$ | $-4.7$ | $-3.5$ |

[a] irreversible,
[b] ferrocene/ferrocenium,
[c] SCE = standard calomel electrode,
[d] against vacuum Suitable matrix materials can be selected on the basis of these values and the emissions. The emitter layer can also be achieved without a matrix by applying the corresponding complex as 100% material. A corresponding embodiment is described below.

In a particularly preferred embodiment, the light-emitting device according to the invention also has a CsF interlayer between the cathode and the emitter layer or an electron-conductor layer. This layer has, in particular, a thickness of 0.5 nm to 2 nm, preferably about 1 nm. This interlayer predominantly causes a reduction in the electron work function.

The light-emitting device is furthermore preferably applied to a substrate, for example to a glass substrate.

In a particularly preferred embodiment, an OLED structure for a sublimable emitter according to the invention comprises, besides an anode, emitter layer and cathode, also at least one, in particular a plurality of and particularly preferably all the layers mentioned below and shown in FIG. 1B.

The entire structure is preferably located on a support material, where, in particular, glass or any other solid or flexible transparent material can be employed for this purpose. The anode, for example an indium tin oxide anode (ITO), is arranged on the support material. A hole-transport layer (HTL), for example $\alpha$-NPD, is arranged on the anode and between the emitter layer and the anode. The thickness of the hole-transport layer is preferably 10 to 100 nm, in particular 30 to 50 nm. Further layers which improve hole-injection, for example a copper phthalocyanine (CuPc) layer, may be arranged between the anode and the hole-transport layer. This additional layer preferably has a thickness of 5 to 50 nm, in particular 8 to 15 nm. An electron-blocking layer, which ensures that electron transport to the anode is suppressed since a current of this type would only cause ohmic losses, is preferably applied to the hole-transport layer and between the hole-transport layer and the emitter layer. The thickness of this electron-blocking layer is preferably 10 to 100 nm, in particular 20 to 40 nm. This additional layer can be omitted, in particular, if the HTL layer is already intrinsically a poor electron conductor.

The next layer is the emitter layer, which comprises or consists of the emitter material according to the invention. In the embodiment using sublimable emitters, the emitter materials are preferably applied by sublimation. The layer thickness is preferably between 10 nm and 200 nm, in particular between 50 nm and 150 nm. The emitter material according to the invention may also be co-evaporated together with other materials, in particular with matrix materials. For emitter materials according to the invention which emit in the green or red, common matrix materials such as PVK or CBP are suitable. However, it is also possible to construct a 100% emitter material layer. For emitter materials according to the invention which emit in the blue, UHG matrix materials are preferably employed (cf. M. E. Thompson et al., Chem. Mater. 2004, 16, 4743). In order to produce light of mixed colour on use of compounds according to the invention with different metal central ions, coevaporation can likewise be used.

In principle, it is possible to employ in accordance with the invention common matrix materials for OLEDs, but also substantially inert polymers or small matrix molecules without particularly pronounced hole or electron mobilities as matrix materials.

A hole-blocking layer, which reduces ohmic losses which could arise due to hole currents to the cathode, is preferably applied to the emitter layer. This hole-blocking layer preferably has a thickness of 10 to 50 nm, in particular 15 to 25 nm. A suitable material for this purpose is, for example, BCP (4,7-diphenyl-2,9-dimethylphenanthroline, also known as bathocuproin). An ETL layer comprising electron-transport material (ETL=electron-transport layer) is preferably applied to the hole-blocking layer and between this layer and the cathode. This layer preferably consists of vapour-depositable $Alq_3$ having a thickness of 10 to 100 nm, in particular 30 to 50 nm. An interlayer, for example of CsF or LiF, is preferably applied between the ETL layer and the cathode. This interlayer reduces the electron-injection barrier and protects the ETL layer. This layer is generally applied by vapour deposition. The interlayer is preferably very thin, in particular having a thickness of 0.2 to 5 nm, more preferably 0.5 to 2 nm. Finally, a conductive cathode layer is also applied by vapour deposition, in particular having a thickness of 50 to 500 nm, more preferably 100 to 250 nm. The cathode layer preferably consists of Al, Mg/Ag (in particular in the ratio 10:1) or other metals. Voltages of between 3 and 15 V are preferably applied to the OLED structure described for a sublimable emitter according to the invention.

The OLED device can also be manufactured partially by wet-chemical methods, for example with the following structure: glass substrate, transparent ITO layer (of indium tin oxide), for example PEDOT/PSS (polyethylenedioxythiophene/polystyrenesulfonic acid, for example 40 nm) or other layers which improve hole injection, 100% complex according to the invention (for example 10 to 80 nm) or doped (for example 1%, in particular 4% to 10%) into a suitable matrix (for example 40 nm), vapour-deposited $Alq_3$ (for example 40 nm), vapour-deposited LiF or CsF as protective layer (for example 0.8 nm), vapour-deposited metal cathode Al or Ag or Mg/Ag (for example 200 nm).

An OLED structure for a soluble emitter according to the invention particularly preferably has the structure described below and shown in FIG. 2, but comprises at least one, more preferably at least two and most preferably all the layers mentioned below.

The device is preferably applied to a support material, in particular to glass or another solid or flexible transparent material. An anode, for example an indium tin oxide anode, is applied to the support material. The layer thickness of the anode is preferably 10 nm to 100 nm, in particular 30 to 50 nm. An HTL layer of a hole-conductor material, in particular of a hole-conductor material which is water-soluble, is applied to the anode and between the anode and the emitter layer. A hole-conductor material of this type is, for example, PEDOT/PSS (polyethylenedioxythiophene/poly-styrenesulfonic acid) or novel HTL materials (DuPont) for extending the device lifetime. The layer thickness of the HTL layer is preferably 10 to 100 nm, in particular 40 to 60 nm. The emitter layer (EML) which comprises a soluble emitter according to the invention is applied next. The material can be dissolved in a solvent, for example in acetone, dichloromethane or acetonitrile. This may prevent dissolution of the underlying PEDOT/PSS layer. The emitter material according to the invention can be employed in low concentration, for example 2 to 10% by weight, but also in higher concentration or as a 100% layer. It is also possible to apply the emitter material highly or moderately doped in a suitable polymer layer (for example PVK). For low-solubility emitter materials according to the invention, application by means of a colloidal suspension in a polymer can be carried out. Oligomer strands can be comminuted with ultrasound treatment before introduction into the polymer and introduced into the polymer after filtering through nanofilters. The emitter layer preferably has a layer thickness of 10 to 80 nm, in particular 20 to 60 nm. A layer of electron-transport material is preferably applied to the emitter layer, in particular with a layer thickness of 10 to 80 nm, more preferably 30 to 50 nm. A suitable material for the electron-transport material layer is, for example, $Alq_3$, which can be applied by vapour deposition. A thin interlayer which reduces the electron-injection barrier and protects the ETL layer is preferably applied next. This layer preferably has a thickness of between 0.1 and 2 nm, in particular between 0.5 and 1.5 nm, and preferably consists of CsF or LiF. This layer is generally applied by vapour deposition. For a further simplified OLED structure, the ETL layer and/or the interlayer may optionally be omitted.

Finally, a conductive cathode layer is applied, in particular by vapour deposition. The cathode layer preferably consists of a metal, in particular of Al or Mg/Ag (in particular in the ratio 10:1).

Voltages of 3 to 15 V are preferably applied to the device.

It is essential to the invention that the light-emitting device comprises at least one complex of the formula (I) as emitter.

Free biphenyl exhibits fluorescence between 300 and 350 nm on excitation in the UV (cf. I. B. Berlman, *Handbook of Fluorescence Spectra of Aromatic Molecules, Academic Press,* 1971) and phosphorescence at 433 nm (in butyronitrile, 77 K, but not at room temperature), (cf. M. Maestri et al., *Helv. Chim. Acta* 1988, 71, 1053). Owing to the steric interaction of the orthohydrogen atoms, the two phenyl groups are twisted relative to one another, reducing the conjugation length. In the case of coordination in the 2,2'-position at a single centre, the rings are planarised, and the π-system becomes larger. For this reason, emissions in the visible region are to be expected. As ligand in complexes of heavy transition metals, the strong spin-track coupling enables effective phosphorescence to be obtained, which facilitates use as triplet emitter in OLED devices. 2,2'-Biphenyl complexes of platinum are a class of compounds which has been well investigated. The first (bph)Pt compound was (bph)Pt (NBD), which was synthesised by Gardner et al. and which they were able to obtain in very low yield from $(NBD)PtCl_2$ and 2,2'-dilithiobiphenyl (bph=$\eta^2$-biphenyl-2,2'-diyl, NBD=norbornadiene), (cf. S. A. Gardner, H. B. Gordon, M. D. Rausch, *J. Organomet. Chem.* 1973, 60, 179). A method which can be used preparatively was presented by Usón et al. with the synthesis of (bph)Pt(COD) from $(bph)Sn(^nPr)_2$ and $[PtCl_2(COD)]$, where COD=cyclooctadiene and $^nPr$=n-propyl (cf. R. Usón et al., *J. Organomet. Chem.* 1980, 198, 105). Further derivatives were subsequently prepared by this method and by the reaction of 2,2'-dilithiobiphenyl with trans-$[PtCl_2(Et_2S)_2]$ (cf. C. Cornioley-Deuschel, A. von Zelewsky, *Inorg. Chem.* 1987, 26, 3354 and H.-A. Brune et al., *J. Organomet. Chem.* 1991, 402, 179). A multiplicity of studies is subsequently concerned with syntheses (cf. H.-A. Brune et al., *J. Organomet. Chem.* 1991, 412, 237; B. L. Edelbach et al., *Organometallics* 1998, 17, 4784; R. E. Marsh, *Acta Crystallogr., Sect. B: Struct. Sci.* 1997, 53, 317;

A. C. Stuckl et al., Z. Kristallogr. 1993, 208, 294; A. C. Stuckl et al., *Kristallogr.* 1993, 208, 302; X. Zhang et al., *Organometallics* 1999, 18, 4887; J. DePriest et al., *Inorg. Chem.* 2000, 39, 1955; B. L. Edelbach et al., *J. Am. Chem. Soc.* 1998, 120 2843; Y.-H. Chen et al., *Inorg. Chim. Acta* 1995, 240, 41; Y. Chen et al., *J. Chem. Cryst.* 1996, 26, 527; H. A. Brune et al., *J. Organomet. Chem.* 1991, 402, 435; G. Y. Zheng et al., *Inorg. Chem.* 1999, 38, 794; N. Simhai et al., *Organometallics* 2001, 20, 2759; C. B. Blanton et al., *Inorg. Chem.* 1992, 31, 3230; C. B. Blanton et al., *Inorg. Chim. Acta* 1990, 168, 145; C. N. Iverson at aL, *Organometallics* 2002, 21, 5320), solid-state structures (cf. B. L. Edelbach et al., *Organometallics* 1998, 17, 4784; X. Zhang et al., *Organometallics,* 1999, 18, 4887; J. DePriest et al., *Inorg. Chem.* 2000, 39, 1955; B. L. Edelbach et al., *J. Am. Chem. Soc.* 1998, 120, 2843; Y.-H. Chen et al., *Inorg. Chim. Acta* 1995, 240, 41; Y. Chen et al., *J. Chem. Cryst.* 1996, 26, 527; H.-A. Brune et al., *J. Organomet. Chem.* 1991, 402, 435; G. Y. Zheng et al., *Inorg. Chem.* 1999, 38, 794; N. Simhai et al., *Organometallics* 2001, 20, 2759; M. A. Bennett et al., *J. Chem. Soc.*, Dalton Trans. 1998, 217; T. Debaerdemaeker et al., *J. Organomet. Chem.* 1991, 412, 243; T. Debaerdemaeker et al., *J. Organomet. Chem.* 1991, 410, 265; K. Yu et al., *Organometallics* 2001, 20, 3550; T. Debaerdemaeker et al., *J. Organomet. Chem.* 1988, 350, 109), reactivities (cf. C. Cornioley-Deuschel, A. von Zelewsky, *Inorg. Chem.* 1987, 26, 3354; X. Zhang et al., *Organometallics* 7999, 18, 4887; B. L. Edelbach at al., *J. Am. Chem. Soc.* 1998, 120, 2843; Y.-H. Chen et al., *Inorg. Chim. Acta* 1995, 240, 41; N. Simhai et al., *Organometallics* 2001, 20, 2759; K. Yu et al., *Organometallics* 2001, 20, 3550; M. R. Plutino et al., *Inorg. Chem.* 2000, 39, 2712; M. R. Plutino et al., *J. Am. Chem. Soc.* 2004, 126, 6470), and spectroscopic properties (cf. M. Maestri et al., *Helv. Chim. Acta* 1988, 71, 1053; C. Cornioley-Deuschel, A. von Zelewsky, *Inorg. Chem.* 1987, 26, 3354; H.-A. Brune et al., *J. Organomet. Chem.* 1991, 402, 179; J. DePriest et al., *Inorg. Chem.* 2000, 39, 1955; Y.-H. Chen et al., *Inorg. Chim. Acta* 1995, 240, 41; Y. Chen et al., *J. Chem. Cryst.* 1996, 26, 527; G. Y. Zheng et al., *Inorg. Chem.* 1999, 38, 794; C. B. Blanton et al., *Inorg. Chem.* 1992, 31, 3230; C. B. Blanton et al., *Inorg. Chim. Acta* 1990, 168, 145; G. Y. Zheng et al., lnorg. Chem. 1998, 37, 1392; S. R. Stoyanov et al., *Inorg. Chem.* 2003, 42, 7852) of complexes in which both the biphenyl group has been modified by substitution and also the COD has been replaced by other ligands.

Surprisingly, it has now been found in accordance with the invention that compounds of the formula (I) are eminently suitable as emitter molecules for light-emitting devices and in particular for organic light-emitting devices (OLEDs).

In accordance with the invention, the emitter molecules employed are complexes of the formula (I) (s-bph)ML. These complexes are, in particular, luminescent compounds. The complexes have a central atom selected from Pt, Rh, Ir, Pd and Au. The central atom is preferably in the form of Pt(II), Rh(I), Pd(II) or Au(III), i.e. in the form of a singly or doubly or triply positively charged ion. The central atom is particularly preferably Pt(II). In accordance with the invention, the central atom is tetracoordinated, with, in particular, square-planar complexes being involved. Tetracoordinated complexes with 16 valence electrons, in particular with Pt(II), are particularly favourable.

Furthermore, the complex employed in accordance with the invention includes a group L, which is a bidentate ligand, or the group $X_2$, where each X, independently, represents a monodentate ligand. In a first preferred embodiment, L is a bulky ligand. If the complex centre M is sufficiently screened by bulky ligands or a complex arrangement with short M-M separations is prevented, M-M interactions cannot form in the solid or in concentrated solutions. Steric screening by the ligand L may in addition cause a reduction in quench processes and consequently an increase in the photoluminescence quantum yield. Suitable bulky ligands L are, for example, bidentate phosphines, amines, arsines or dienes. When selecting preferred ligands L, the criteria of bulk, high ligand field strength and stability of the resultant complexes as well as high-energy triplet level, in particular, are taken into account.

Examples of preferred ligands L, which are each neutral and bond in a bidentate manner (chelates), are:

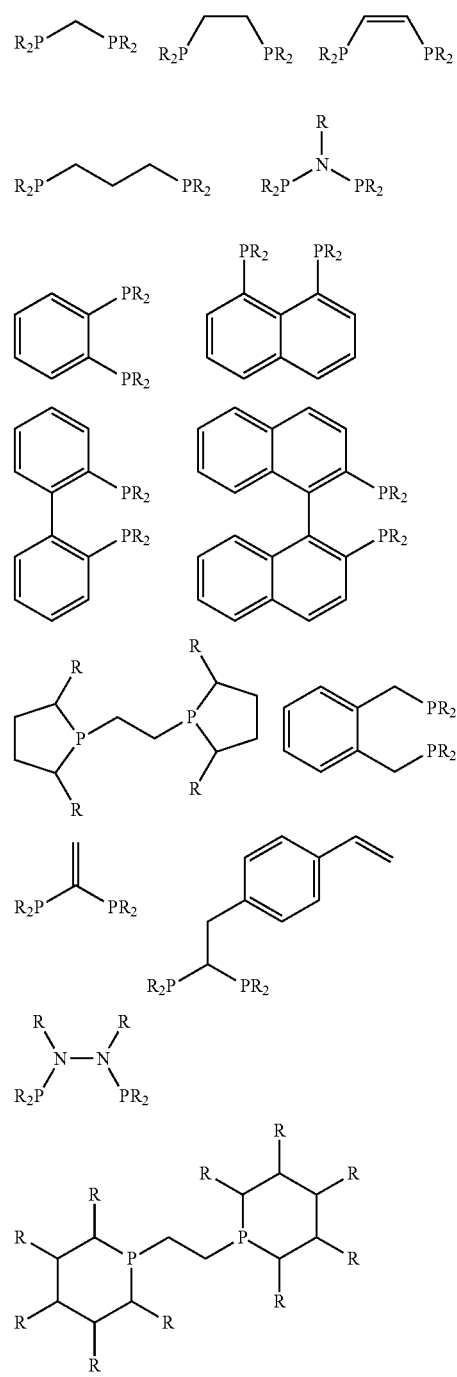

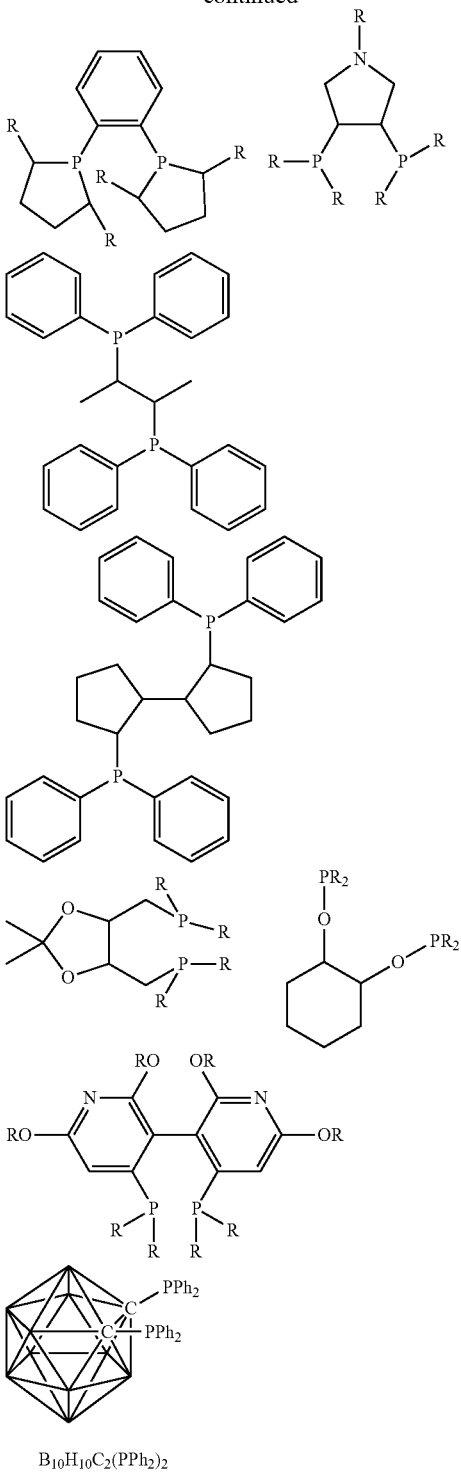

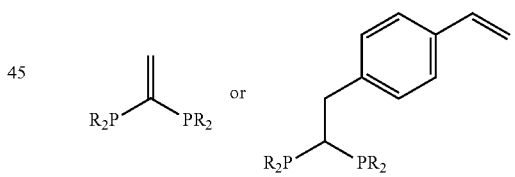

where the phosphorus atoms may each be replaced, independently, by nitrogen atoms or arsenic atoms and where R in each case represents hydrogen, an alkyl, aryl, alkoxy, aryloxy, alkylamine or arylamine group, which may optionally be substituted or/and may have one or more heteroatoms. The heteroatoms are, in particular, selected from O, S, N, P, Si and/or Se. Suitable substituents are, for example, halogen, in particular F, Cl, Br or I, alkyl, in particular $C_1$ to $C_{20}$, more preferably $C_1$ to $C_6$-alkyl, aryl, OR, SR or $PR_2$. In many cases, it is preferred for L to contain at least one fluorine atom as substituent in order to increase the volatility of the complex.

Unless indicated otherwise, the term alkyl or Alk, as used herein, in each case, independently, denotes a $C_1$-$C_{20}$, in particular a $C_1$-$C_6$ hydrocarbon group. The hydrocarbon groups may be linear or branched and may be saturated or have one or more C=C double bonds.

The term aryl denotes an aromatic system having 5 to, for example, 20 C atoms, in particular having 6 to 10 C atoms, in which one or more C atoms may optionally be replaced by heteroatoms (for example N, S, O).

Polymer-Bound Emitters/Monomer or Oligomer Emitters

In a further preferred embodiment, the complex of the formula (I) (s-bph)ML present in accordance with the invention in the emitter layer originates from a complex of the formula (III)

(s-bph)ML', where L' represents a ligand which has a polymerisable group. The (s-bph)ML complex here may be immobilised on a polymer by functionalisation of the ligand L by means of a polymerisable group. This demobilises the complex, preventing undesired crystallisation of the emitter in the emitter layer, which is frequently a reason for a limited device lifetime of OLEDs. In this embodiment, the complex of the formula (I) is bonded to a polymer in the emitter layer via the polymerisable ligand. The bonding to a polymer enables a homogeneous distribution of the emitter in the emitter layer and in addition reliable control of the complex content to be achieved. In order to provide the light-emitting devices according to the invention, a polymer which contains (s-bph)ML' groups bonded as units can firstly be prepared and then applied, for example as a solution by means of spin coating or ink-jet printing. However, it is also possible for a monomer to be applied and polymerised on site. Suitable ligands L' include, for example, the ligands L indicated above, which additionally contain a radical which is polymerisable, for example a C=C radical. The following ligands L' are particularly preferred:

in which R is as defined above.

The phosphine $CH_2$=C($PR_2$)$_2$ is commercially available. Through complexing to a metal, the β-function attains a positive partial charge and is therefore activated for nucleophilic attack. This group can therefore be attached to a polymer or can serve as monomer unit for the construction of a polymer, where the monomers to be reacted with the phosphine are, in particular, nucleophiles, such as, for example, alcohols, thiols, primary amines or phosphines, silanes or boranes which have been functionalised by means of a vinyl group. Also possible is attachment to a polymer which has been functionalised by means of a nucleophilic group, for example to polyvinyl alcohol. The other phosphine indicated can be prepared from bis(diphenylphosphino)methane by reaction with n-butyllithium and p-vinylbenzyl chloride and can be polymerised by means of free radicals, anionically, cationically or catalytically.

The invention furthermore relates to a complex of the formula (III)

(s-bph)ML' in which
M represents Pt(II), Rh(I), Pd(II) or Au(III), and
L' represents a bidentate ligand or
L'=X'$_2$, where each X', independently, represents a monodentate ligand,
where L' or at least one X' contains a polymerisable group, and
sbph represents a ligand which has an Ar—Ar group, where Ar represents an aromatic ring system.

Emitters Containing Small Ligands/Oligomer Emitters

In a further embodiment, the emitter layer comprises a complex of the formula (I) in which L=L* as a complex of the formula (s-bph)ML*. The ligand L* is a non-bulky ligand. On use of complexes containing a non-bulky ligand L*, M-M interactions can form in the solid and in the emitter layers with doping of relatively high concentration, resulting in intense photo- or electroluminescence. In this embodiment, the emitter layer comprises complexes of the formula (I) in a concentration of, for example, >10% by weight, based on the total weight of the emitter layer, in particular >20% by weight, more preferably >50% by weight, in particular >80% by weight and most preferably >90% by weight. However, it is also possible to produce emitter layers which consist virtually completely of complexes of the formula (I) and in particular comprise >95% by weight, more preferably >99% by weight. In a further embodiment, the emitter layer consists completely, i.e. 100%, of complexes of the formula (I).

On use of the complexes according to the invention in high concentration in the emitter layer, stacks of the complexes with relatively short metal-metal separations form. Such stacks are formed, in particular, in the case of planar complexes and particularly favourably in the case of planar platinum complexes. In these stacks, strong electronic interactions occur, resulting in completely different emission behaviour than in the case of the monomers. The emission wavelength here is determined by the M-M separation and can be determined in a simple manner by substitution on the (s-bph) group or through the type of ligand L*. The use of highly concentrated emitter layers and in particular crystalline or quasi-crystalline layers offers considerable advantages. In particular, no concentration variations occur during manufacture or they have only small effects in highly concentrated systems. Furthermore, the charge-carrier mobilities, i.e. the electron or hole mobilities, are significantly greater in the case of the formation of crystalline layers than in amorphous layers. In addition, the electronic interaction between the molecules in the oligomers results in a raising of the HOMO and thus improved hole conductivity and a lowering of the LUMO and thus improved electron conductivity.

Furthermore, a high luminous density and high efficiency, i.e. a high quantum efficiency, can be achieved with concentrated emitter layers of this type at high current densities. The emitter complexes employed in accordance with the invention have extremely intense emission with high emission quantum yield due to metal-metal interactions between the central atoms of the individual complexes, in particular owing to metal-metal interactions between planar metal complexes. The emission is thus effected by the interaction of the complexes present in high concentration. In contrast to materials of the prior art, emitter layers having a high proportion of emitter molecules and crystalline emitter layers or emitter layers with quasi-crystalline ordering can thus be produced from uniform units. The use of emitter molecules from the prior art in high concentrations has hitherto not resulted in high-efficiency emitter materials since, in particular, an electronic interaction of adjacent emitter molecules has resulted in self-extinguishing effects. This has the consequence that the emission quantum yield decreases significantly with increasing concentration of the emitter molecules, in particular from a concentration of >10% by weight. Correspondingly, OLEDs are currently only produced in the prior art with emitter molecule concentrations of about 2 to 8% by weight. Due to the stack formation observed in the case of the compounds employed in accordance with the invention, however, the problems occurring in the prior art are at least partially overcome.

However, the use of high concentrations of emitter molecules in the emitter layer and in particular the provision of crystalline emitter layers or emitter layers with quasi-crystalline ordering provides a number of significant advantages:

An emitter layer structure comprising uniform material results in a clearly defined and easily reproducible manufacturing situation.

Slight changes in the molecules employed allow the setting of different metal-metal separations and thus interactions of different strength between the complexes. This results in the possibility of tuning the emission colour from green to red and to the near IR. It is of particular importance that virtually any desired colour can be set by slight chemical variation of the emitter molecules.

The emitter layers can be produced simply by vacuum sublimation methods (and if necessary subsequently gentle conditioning).

The emitter monomer materials have good solubility in many solvents. These crystalline or quasi-crystalline emitter layers can thus also be produced by spin coating or ink-jet printing methods.

The emission quantum yields are very high.

The monomers also have good suitability for chemical linking to polymers. In adjacent monomers, metal-metal interactions can again result in the desired excellent emission properties.

The substances have extremely high chemical stability, which results in high OLED long-term stability.

Due to the metal-metal interactions, the HOMO and the LUMO are electronically delocalised over a large number of molecules (units of the oligomer). This results in a significant improvement in the hole and electron mobility. As a consequence, the emission layer (EML) does not require any additional components for improving the charge-carrier mobility, i.e. the in some cases restrictive requirements of the matrix regarding good charge-carrier mobility are superfluous on use of oligomer emitters.

Specific mixing of different materials (for example (s-bph) Pt(CO)$_2$ with (s-bph)Pd(CO)$_2$), at least one substance of which is described by the formula (I), allows further, independent variation of the properties.

L* can be a flat, neutral or singly or doubly charged bidentate ligand or two monodentate ligands. L* is preferably CN—B—NC, NC—B—CN, diimines, acetylacetonate, [RN—CR=CH—CR=NR]$^-$, 2,2'-biphenylylene, [CH=CR—B—CR=CH]$^{2-}$ or [C≡C—B—C≡C]$^{2-}$, where B is a bridging group, which is an alkylene or arylene group, which may be substituted or/and may contain heteroatoms (for example N, O, P or/and S). In the case where L*=X*$_2$, X* preferably represents CO, CNR, NCR, RN=CR', SCNR, NCSR, NCOR, CN$^-$, SCN$^-$, OCN$^-$, Cl$^-$, Br$^-$, I$^-$, $^-$CH=CRR$^1$, $^-$C≡CR, alkyl, aryl, heteroaryl groups, —OR, —SR, —SeR, —NR$_2$, —PR$_2$, —SiR$_3$, where R and R' each, independently, preferably represent an alkyl or aryl radical, in particular having 1 to 10, more preferably having 1 to 6 C atoms.

The emitter complexes according to the invention having a columnar structure are particularly preferably employed. This structure forms, in particular, at high concentrations of the emitter complexes in the emitter layer since, as stated above, the complexes according to the invention themselves have a planar structure. This enables stacking and the formation of columnar structures. The individual complexes themselves can be neutral, positively or negatively charged and thus preferably have the formula $[(s\text{-}bph)ML]^{n+/m-}$, in which n and m each represent an integer from 0 to 5, more preferably from 0 to 3, and in particular from 1 to 2. The central atom M here is preferably selected from the group Rh(I), Ir(I), Pd(II), Pt(II) and Au(III) and is, in particular, Pt(II). A further variation can be achieved through the formation of columnar structures from different complexes of the formula (I). All ligands and the central atom here can be varied independently of one another, where the complexes can also have, in particular, different charges. In a particular embodiment, columnar salts are prepared, for example of the type $[(sbph)ML^*]^{n+}[(s'\text{-}bph)M'L^{*'}]^{m-}$, where s'-bph, M' and L*' can each have the meanings indicated under s-bph, M and L*, but where at least one of these groups has been varied compared with the positively charged complex.

In the case where $L=X_2$, each X, independently, preferably represents a ligand selected from the group consisting of F−, Cl−, Br−, I−, CN−, R'', OR'', SR'' and PR''$_2$, where each R'', independently, represents an alkyl or aryl group, which may be substituted or/and may have heteroatoms (for example O, N, S, P), where R'' represents, in particular, Me, Et, n-Pr, i-Pr, n-Bu, t-Bu, i-Bu, Bz, Ph, m-Tol, p-Tol, o-Tol, m-PhCl, p-PhCl, o-PhCl, m-PhF, p-PhF, o-PhF or $C_6H_5$.

The complexes according to the invention furthermore contain a ligand s-bph which has an Ar—Ar group, where Ar represents an aromatic ring system, which is independent in each case. Ar can be fused to further aromatic rings or contain one or more heteroatoms and optionally be substituted. Suitable heteroatoms are, for example, O, N and S. Suitable substituents are, for example, halogen, in particular F, Cl, Br or $C_1\text{-}C_6$-alkyl radicals, in particular methyl or t-butyl. Ar is preferably phenyl, thienyl, furyl or pyrrole systems. The Ar—Ar group particularly preferably has one of the following formulae:

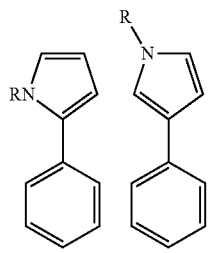

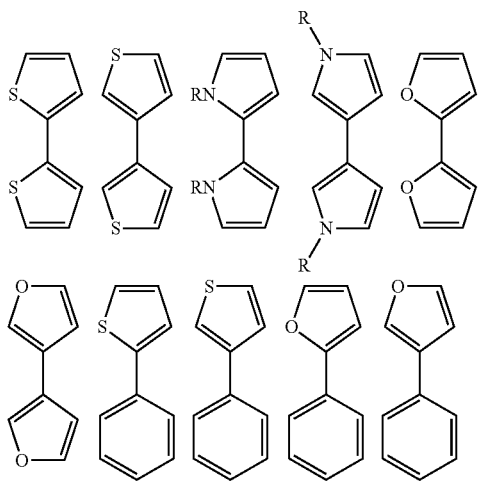

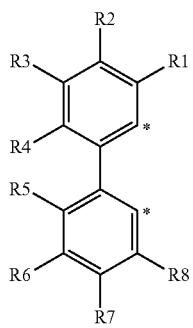

in which R can represent H, alkyl, aryl, heteroaryl, alkenyl or alkynyl.

The ligand s-bph preferably has the formula (II)

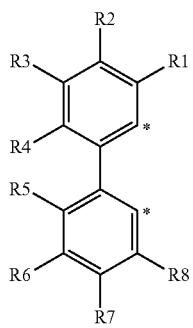

where * represent the metal coordination sites to M, and $R^1$ to $R^8$ each, independently of one another, represent H, alkyl, aryl, heteroaryl, alkenyl, alkynyl, halogen, —NR$_2$, —PR$_2$, —OR or —SR, where R represents H, alkyl, aryl, heteroaryl, alkenyl or alkynyl. The substituents $R^1$ to $R^8$ may be linked to one another and thus form additional aliphatic, aromatic or heteroaromatic rings.

Particularly preferred examples of the ligand s-bph are unsubstituted biphenyl and

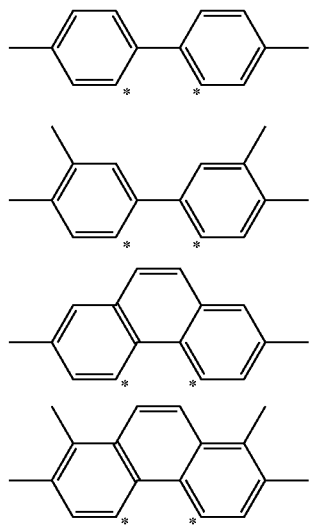

-continued

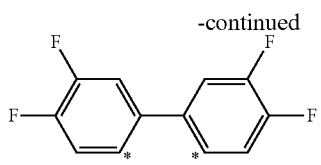

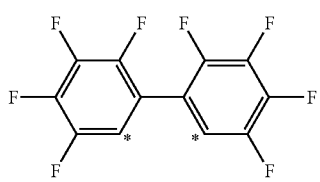

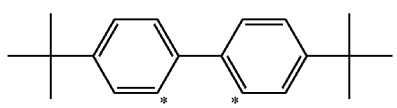

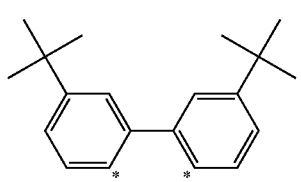

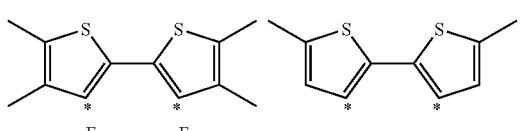

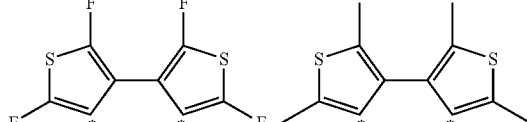

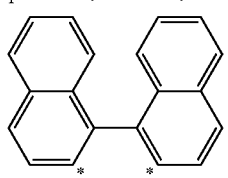

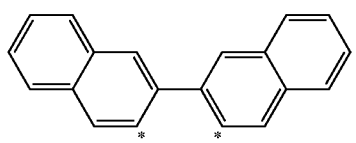

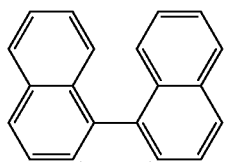

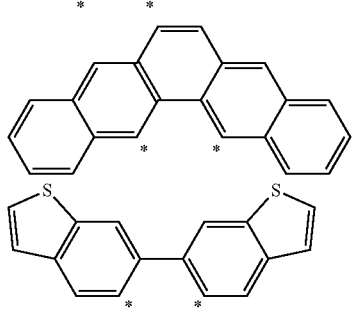

Asymmetrical ligands (not shown) are also advantageous.

The complexes employed in accordance with the invention as emitters can be tuned in the wavelength range in a simple manner (through choice of suitable matrix materials) and particularly through the choice of electron-withdrawing or -donating substituents.

Preference is given to the use of compounds which exhibit emission at a temperature of >−50° C., preferably >0° C., in particular at >10° C. and still more preferably at >20° C. and at temperatures of preferably <100° C., in particular <70° C., more preferably <50° C., still more preferably <40° C.

Particularly advantageous and preferred oligomer-forming complexes are

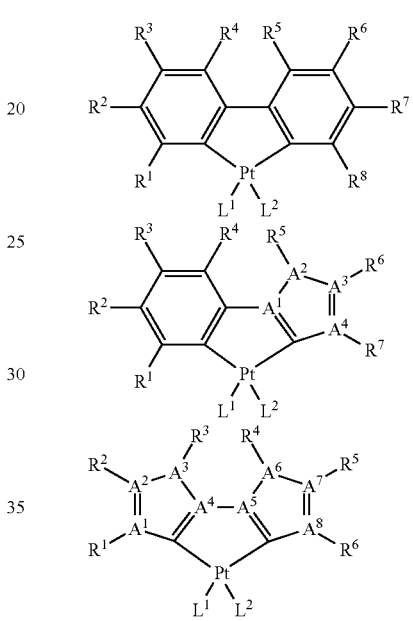

where the atoms $A^1$-$A^8$ are each selected, independently, from C, N, O and S, and in particular the ligands $R^1$-$R^8$ each, independently, represent H, $CH_3$, $C_2H_5$, $CH(CH_3)_2$, $C(CH_3)_3$, $CF_3$, $C_nH_{2n+1}$, F, CN, $OCH_3$, $OC_nH_{2n+1}$, $SCH_3$, $SC_nH_{2n+1}$, $N(CH_3)_2$, $N(C_nH_{2n+1})(C_nH_{2n+1})$, where n=1 to 20, where two or more of the radicals $R^1$ to $R^8$ may also be linked to one another and thus form additional aliphatic, aromatic or heteroaromatic rings, and the ligands $L^1$ and $L^2$ each, independently, represent CO, NC—$CH_3$, NC—$CH(CH_3)_2$, NC—$C_nH_{2n+1}$, CN—$CH_3$, CN—$CH(CH_3)_2$, CN—$C(CH_3)_3$, NC—$C_nH_{2n+1}$, $P(CH_3)_3$, $As(CH_3)_3$, $N(CH_3)_2$, where the ligands $L^1$ and $L^2$ may also be parts of a chelate ligand, for example $(NC)_2C_3H_7$.

Particular preference is given to the complexes:

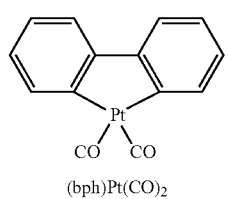

(bph)Pt(CO)$_2$

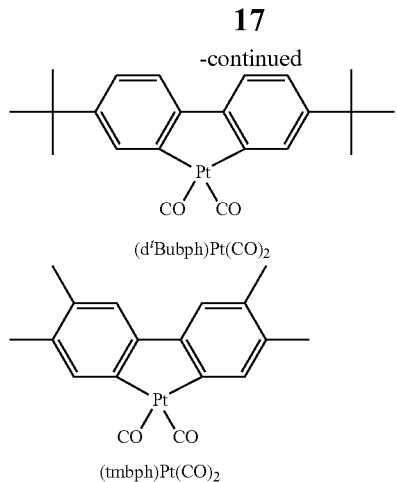

(d^tBubph)Pt(CO)$_2$ (tmbph)Pt(CO)$_2$

Figure 5:
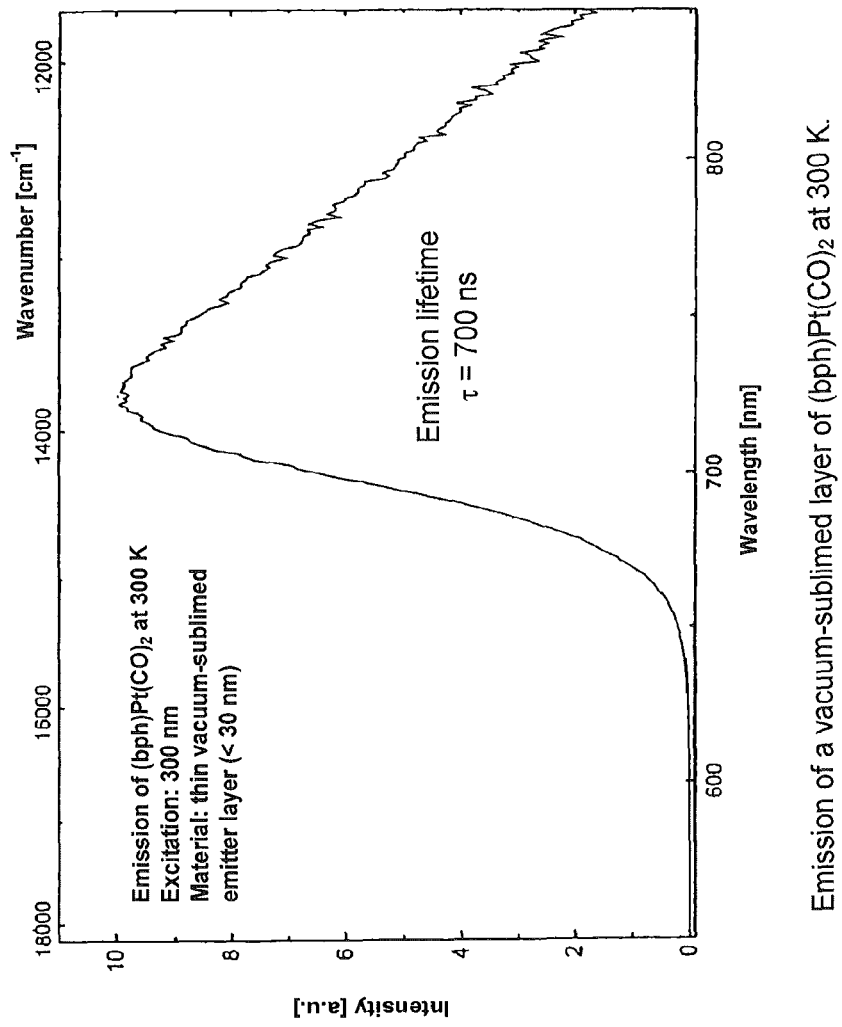
FIG. 5 is the emission of a vacuum-sublimed layer of (bph)Pt(CO)$_2$ at 300 K.

The emission spectra of these complexes are shown in FIGS. 5-7.

Further preferred examples are:

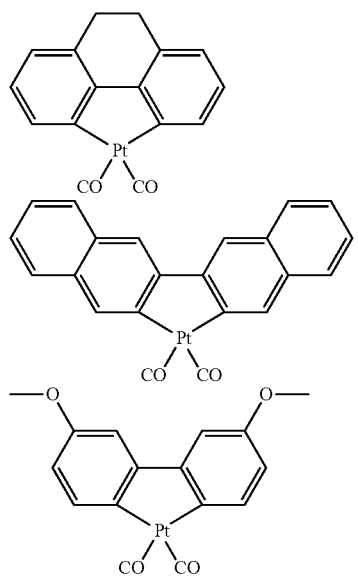

The ring systems of the biphenyl ligand and of the heteroaromatic analogues may also be asymmetrically substituted, which is illustrated by the following examples.

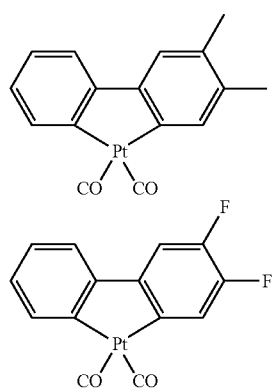

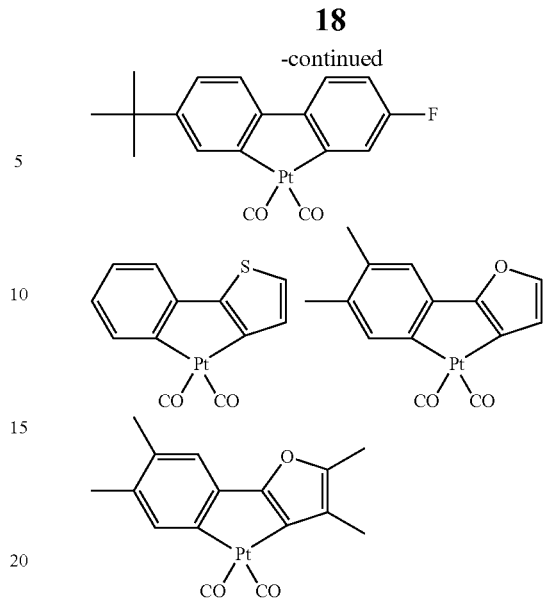

Emitters Containing Bulky Ligands (Monomer Emitters)

Advantageous and preferred monomer complexes containing bulky ligands are

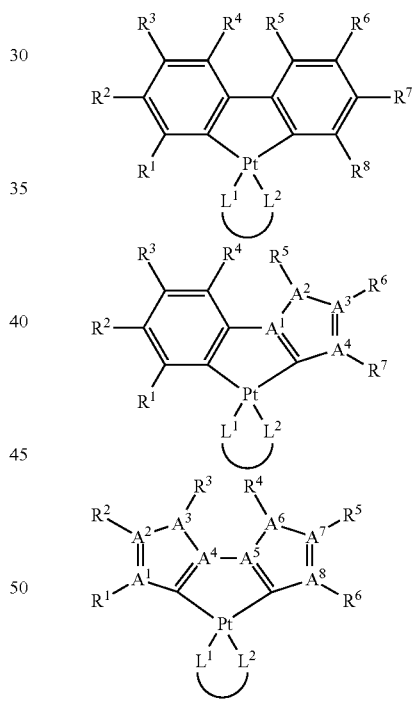

where the atoms $A^1$-$A^8$ are each selected, independently, from C, N, O, S, the ligands $R^1$-$R^8$ each, independently, represent H, $CH_3$, $C_2H_5$, $CH(CH_3)_2$, $C(CH_3)_3$, $CF_3$, $C_nH_{2n+1}$, F, CN, $OCH_3$, $OC_nH_{2n+1}$, $SCH_3$, $SC_nH_{2n+1}$, $N(CH_3)_2$, $N(C_nH_{2n+1})(C_nH_{2n+1})$, where n=1 to 20, where two or more of the radicals $R^1$ to $R^8$ may be linked to one another and thus form additional aliphatic, aromatic or heteroaromatic rings, and $L^1 \cap L^2$ represents diphosphine, diamine, diarsine or diene, in particular a linear or cyclic diene having 6 to 10 C atoms or a diphosphine selected from

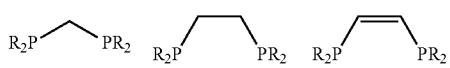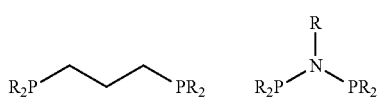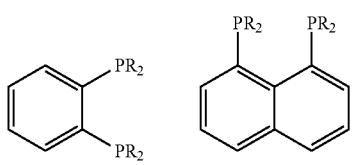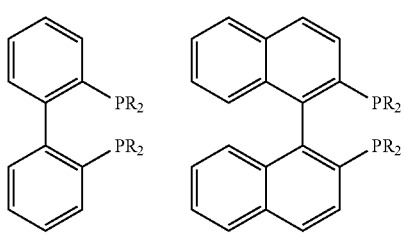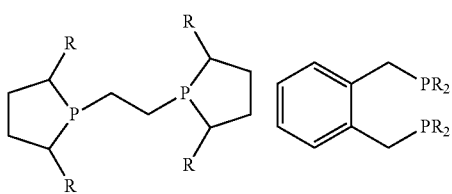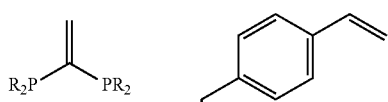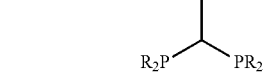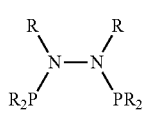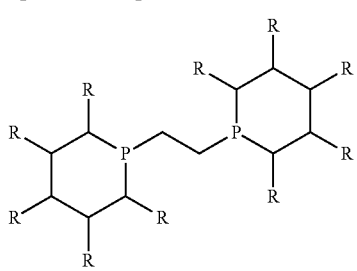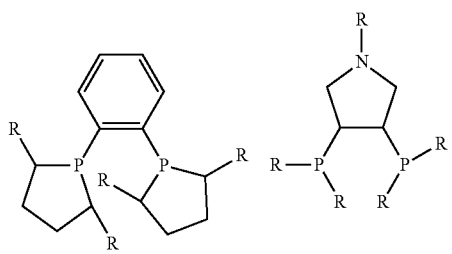
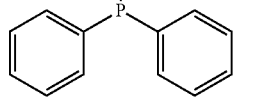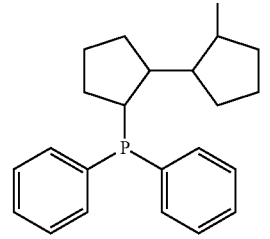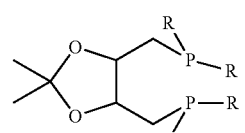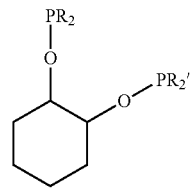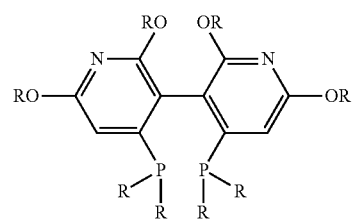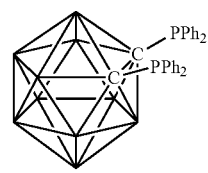
$B_{10}H_{10}C_2(PPh_2)_2$
where R represents alkyl, aryl, alkoxy, phenoxy, alkylamine or arylamine.
$L^1 \cap L^2$ preferably represents $Ph_2P-CH_2-CH_2-PPh_2$ or cyclooctadiene.
Particular preference is given in accordance with the invention to the cornpounds (biphenyl)(cyclooctadiene)platinum, (bph)Pt(COD), or (biphenyl)(bis(diphenylphosphino)ethane)platinum, (bph)Pt(dppe)

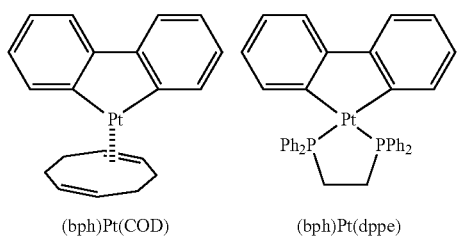

(bph)Pt(COD)   (bph)Pt(dppe)

Figure 4:
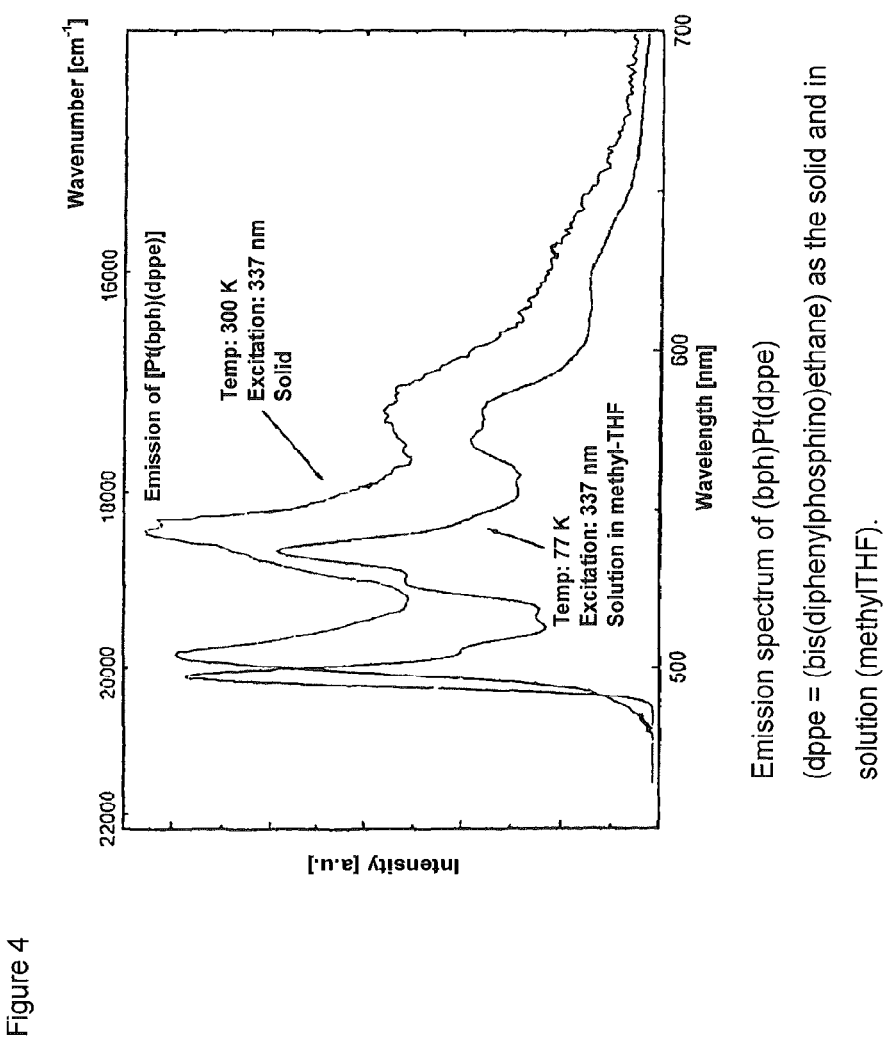
FIG. 4 is the emission spectrum of (bph)Pt(dppe) dppe=(bis(diphenylphosphino)ethane) as the solid and in solution (methylTHF).

The emission spectra of these compounds are shown in FIGS. 3 and 4.

Further particularly preferred compounds are

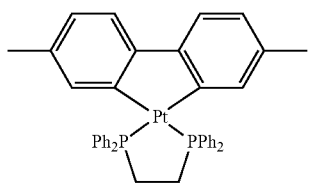

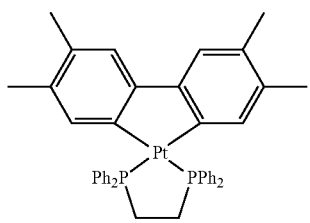

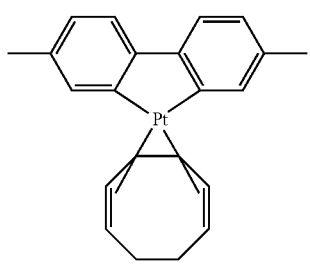

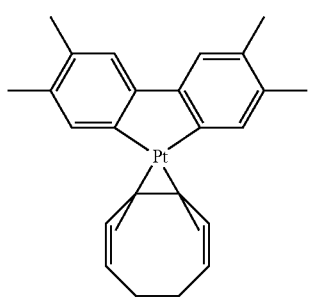

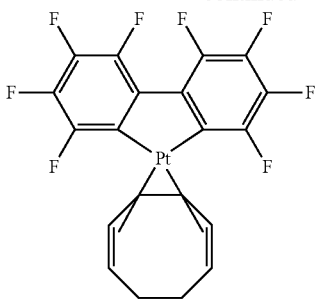

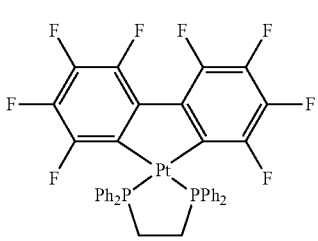

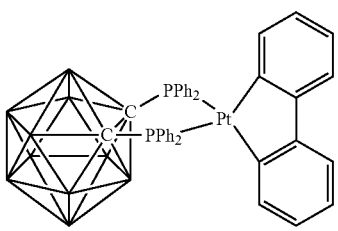

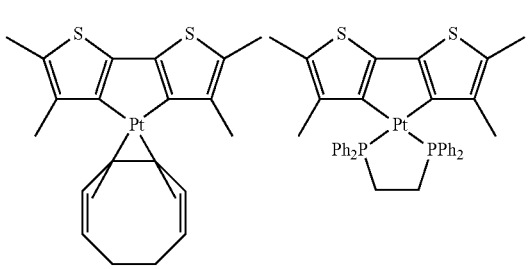

[B$_{10}$H$_{10}$C$_2$(PPh$_2$)$_2$]Pt(bph)

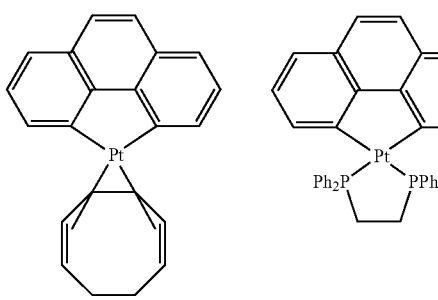

The invention furthermore relates to the use of a compound of the formula (I) as defined herein as emitter of a light-emitting device, in particular in an organic light-emitting device.

The invention is explained in greater detail by the attached figures and the examples below.

TABLE 1

Emission properties and electrochemical data of selected biphenyl-Pt(II) complexes

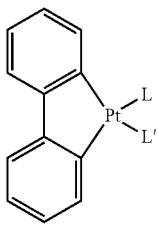

| Ligands L, L' | Solvent | Temperature [K] | $\lambda_{em}$ [nm] | Emission lifetime, $\tau$ [µs] | Photoluminescence quantum yield $\phi_{PL}$ |
|---|---|---|---|---|---|
| MeCN | MeCN | RT | 493, 532, 569, 612 | 14 | 0.031 |
|  |  | 77 | 489 | 15.7 | 0.18 |
| dppm | EtOH/MeOH | 77 | 509, 548, 585 | 16.7 |  |
|  |  | 296 |  |  | 0.0015 |
| Et$_2$S | DCM | 298 | 497, 532, 569, 620 | 10.5 |  |
|  | DCM/EtOH | 77 | 490 | 12.2 | 0.0077 |
| en | DCM | 298 | 493 | 7.0 |  |
|  |  | 77 | 489 | 14.4 | 0.16 |
| py | DCM | 298 | 492 | 3.2 |  |
|  |  | 77 | 488 | 7.6 | 0.15 |
| dppf | EtOH/MeOH | 77 | 500 | 6.2 |  |
| bpy | BN | 77 | 578 | 1.1 | 0.2 |
| COD | MeOH/EtOH | 298 | 537, 573, 611 | 14.5 | 0.0018 |
|  |  | 77 |  | 1.9 |  |
| CO | MeTHF/MeOH | 296 | 506 |  |  |
|  | DCM | 296 | 515 |  |  |
|  | EtOH/EtOH | 296 |  | 2.2 | 0.036 |
|  | MeTHF/DCM | 296 |  | 0.7 | 0.0094 |

Me—methyl,
dppm—bis(diphenylphosphino)methane,
Et—ethyl,
DCM—dichloromethane,
en—ethylenediamine,
py—pyridine,
dppf—1,1'-bis-(diphenylphosphino)ferrocene,
bpy—2,2'-bipyridine,
BN—butyronitrile,
COD—cyclooctadiene,
THF—tetrahydrofuran FIG. 1A shows an example of an OLED device manufactured by means of vacuum sublimation.

The following definitions refer to FIG. 1A
ETL=electron transporting layer
EML=emitter layer
HTL=hole transporting layer
HIL=hole injection layer
Alq$_3$=Aluminium-8-hydroxy-quinoline
A-NPD=4,4'-Bis[N-(1-naphthyl)-N-phenylamino]biphrnyl
CuPu=copper phthalocyanine
UGH is an "ultrahigh energy gap host" matrix material having a large singlet
S$_o$-triplet T$_1$ energy gap. UGH 2 (=p-bis(triphenylsilyl)benzene) or UGH 3
(=m-bis(triphenylsilyl)benzene) is preferred
ITO=indium tin oxide FIG. 2 shows an example of an OLED device with emitters according to the invention which are applied by wet-chemical methods.

FIGS. 3 and 4 show the emission spectra of two examples [(bph)Pt(COD) and (bph)Pt(dppe)]. Monomer emission occurs here owing to the bulky ligands. Both compounds exhibit yellow or yellow-green emission, which is strongly red-shifted compared with the fluorescence of biphenyl. Owing to the structuring of the emission bands and the lifetimes in the µs region, phosphorescence can be assumed, resulting to an approximation from an intraligand transition.

FIG. 5 shows the emission of a vacuum-sublimed layer of (bph)Pt(CO)$_2$ at 300 K. Oligomer emission (stack emission) occurs here owing to the small ligands.

FIGS. 6 and 7 show the emission spectra of (d'Bubph)Pt(CO)$_2$ and of (tmbph)Pt(CO)$_2$.

Preparation of Selected Biphenyl-Pt(II) Complexes

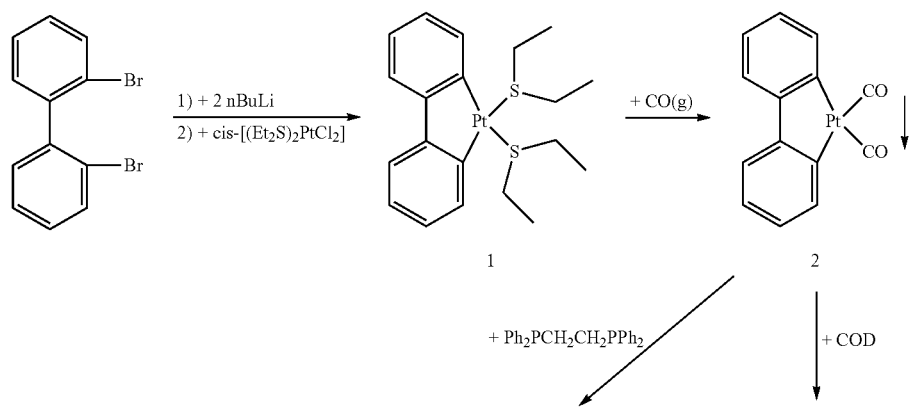

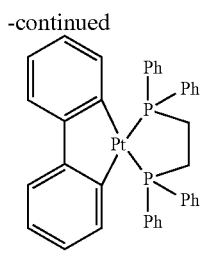

3

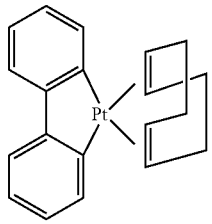

4

[nBuLi stands for "butyllithium]

Biphenyl-Pt(II) complexes are prepared from 2,2'-dilithiobiphenyl (from 2,2'-dibromobiphenyl and nBuLi) and cis-[(Et$_2$S)$_2$PtCl$_2$]. The diethyl sulfide complex 1 present in situ is not isolated since experience suggests that the purification would result in large losses, but instead is converted, by passing in carbon monoxide, directly into the dicarbonyl compound 2, which precipitates out of the reaction solution as a green precipitate. The complex 2 is a highly suitable starting compound for the synthesis of further derivatives since the carbon monoxide can be replaced very simply by other ligands. For example, vigorous evolution of gas is observed on addition of diphosphines or COD to a suspension of 2, and the complexes 3 and 4 can be isolated in high yields and high purity.

The invention claimed is:

1. A light-emitting device comprising
    (i) an anode,
    (ii) a cathode and
    (iii) an emitter layer arranged between and in direct or indirect contact with the anode and the cathode, comprising at least one complex of the formula (I)

(s-bph)ML  (I)

in which M represents Pt(II), Rh(I), Ir(I), Pd(II) or Au(III),
    L represents a bidentate ligand selected from phosphines, amines, arsines, and dienes, or L=X$_2$, where each X, independently, represents a monodentate ligand, and
    s-bph represents the formula (II)

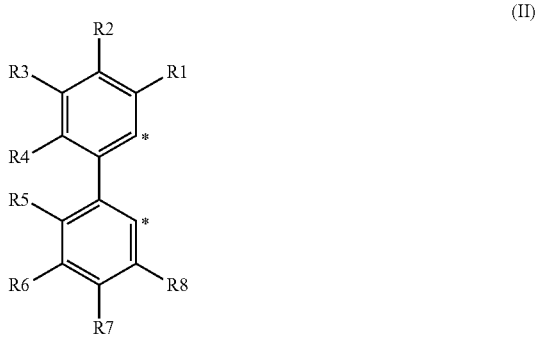

wherein R$^1$ to R$^8$ each, independently of one another, represent H, alkyl, aryl, heteroaryl, alkenyl, alkynyl, halogen, —NR$_2$, —PR$_2$, —OR or —SR, wherein R is H, alkyl, aryl, heteroaryl, alkenyl or alkynyl, and wherein the radicals R$^1$ to R$^8$ are optionally linked to one another, and * represent the coordination sites of the ligand; and
wherein the complex of the formula (I) forms an oligomer emitter.

2. The light-emitting device according to claim 1, wherein the proportion of complexes of the formula (I) in the emitter layer is greater than 10% by weight, based on the total weight of the emitter layer.

3. The light-emitting device according to claim 2, wherein the proportion of complexes of the formula (I) in the emitter layer is greater than 80% by weight based on the total weight of the emitter layer.

4. The light-emitting device according to claim 2, wherein the proportion of complexes of the formula (I) in the emitter layer is 100% by weight, based on the total weight of the emitter layer.

5. The light-emitting device according to claim 2, wherein L=X$_2$, where each X is selected, independently, from CO, CNR, NCR, RN=CR', SCNR, NCSR, NCOR, SCN$^-$, OCN$^-$, F$^-$, Cl$^-$, Br$^-$, I$^-$, $^-$CH=CRR', $^-$C≡CR, alkyl, aryl, heteroaryl groups, $^-$OR, $^-$SR, $^-$SeR, $^-$NR$_2$, $^-$PR$_2$ or $^-$SiR$_3$,
where R and R' each, independently of one another, represent H, alkyl, aryl, heteroaryl, alkenyl, alkynyl, halogen, —NR"$_2$, —PR"$_2$, —OR" or —SR", where R" represents H, alkyl, aryl, heteroaryl, alkenyl or alkynyl, or where R and R' may also be linked to one another.

6. The light-emitting device according to claim 1, wherein the emitter comprises the compound (bph)Pt(CO)$_2$, (d$^t$Bub-ph)Pt(CO)$_2$ or (tmbph)Pt(CO)$_2$.

7. The light-emitting device according to claim 1, wherein complexes of the formula (I) are present in the emitter layer in a columnar structure.

8. The light-emitting device according to claim 7, wherein at least two different complexes of the formula (I) are present in the columnar structure.

9. The light-emitting device according to claim 1, wherein the complex of the formula (I) in the emitter layer is bonded to a polymer.

10. The light-emitting device according to claim 9, wherein the bonding to the polymer takes place via a polymerizable group of L.

11. The light-emitting device according to claim 10, wherein the complex of the formula (I)

(s-bph)ML  (I)

is formed from a complex of the formula (III)

(s-bph)ML'  (III)

in which L' represents a bidentate ligand which has a polymerizable group.

12. The light-emitting device according to claim 11, wherein L' has the formula

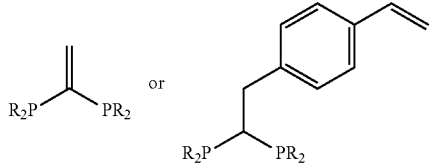

in which R represents alkyl, aryl, alkoxy, phenoxy, alkylamine or arylamine.

13. The light-emitting device according to claim 11, wherein monomers of the formula (III) are applied and subsequently polymerised.

14. The light-emitting device according to claim 9, wherein an emitter layer which comprises a polymer to which complexes of the formula (I) are bonded is applied.

15. The light-emitting device according to claim 9, wherein M in formula (I) represents Pt (II).

16. The light-emitting device according to claim 1, wherein the device furthermore comprises a hole-conductor layer or/and an electron-conductor layer.

17. The light-emitting device according to claim 1, wherein the device furthermore comprises a CsF or LiF interlayer.

18. The light-emitting device according to claim 1, wherein the device is arranged on a substrate.

19. The light-emitting device according to claim 1, wherein the complex present in the emitter layer is a triplet emitter.

20. The light-emitting device according to claim 1, wherein the emitter layer comprises complexes of the formula (I) in a concentration of 1 to 10% by weight, based on the total weight of the emitter layer.

21. A process for the production of the light-emitting device according to claim 1, which comprises introducing at least one complex of the formula (I) as oligomer emitter in the emitter layer by means of vacuum sublimation.

22. A process for the production of the light-emitting device according to claim 1, which comprises introducing at least one complex of the formula (I) as oligomer emitter in the emitter layer by a wet-chemical method.

23. An oligomer comprising at least five complexes of the formula (I)

(s-bph)ML   (I)

in which M represents Pt(II), Rh(I), Ir(I), Pd(II) or Au(III),

L represents a bidentate ligand selected from phosphines, amines, arsines, and dienes, or L=$X_2$, where each X, independently, represents a monodentate ligand, and s-bph represents the formula (II)

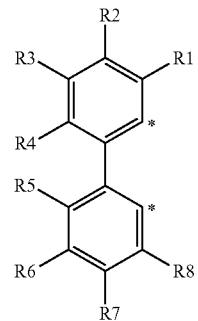

wherein $R^1$ to $R^8$ each, independently of one another, represent H, alkyl, aryl, heteroaryl, alkenyl, alkynyl, halogen, —$NR_2$, —$PR_2$, —OR or —SR, wherein R is H, alkyl, aryl, heteroaryl, alkenyl or alkynyl, and wherein the radicals $R^1$ to $R^8$ are optionally linked to one another, and * represent the coordination sites of the ligand.

24. The oligomer according to claim 23, comprising at least 10 complexes of the formula (I).

25. The oligomer according to claim 23, wherein the at least five complexes are arranged as a stack.

26. The oligomer according to claim 23, wherein the oligomer has a columnar structure.

27. The oligomer according to claim 23, wherein the oligomer further comprises complexes of the formula (s-bph)ML*, in which s-bph represents a ligand which has an Ar—Ar group, where Ar represents an aromatic ring system, M represents Pt(II), Rh(I), Ir(I), Pd(II) or Au(III), and L* represents CN-α-NC, NC-α-CN, diimine, acetylacetonate, [RN—CR'=CH—CR'=NR]$^-$, 2,2'-biphenylylene, [CH=CR—B—CR=CH]$^{2-}$, or [C≡C—B—C≡C]$^{2-}$, where B is a bridging group, which is an alkylene or arylene group, optionally substituted and optionally containing heteroatoms, or in the case where L*=X*$_2$, wherein X* represents CO, CNR, NCR, RN=CR', SCNR, NCSR, NCOR, CN$^-$, SCN$^-$, OCN$^-$, F$^-$, Cl$^-$, Br$^-$, I$^-$, $^-$CH=CRR$^1$, $^-$C≡CR, alkyl, aryl, heteroaryl group, —OR, —SR, —SeR, —$NR_2$, —$PR_2$, or —$SiR_3$, where R and R' each, independently, represent an alkyl or aryl radical.

28. The oligomer according to claim 23, wherein the oligomer further comprises a structural element [(s-bph)ML*]$^{n+}$[(s'-bph)M'L*']$^{m-}$, where M and M' each, independently, represent Pt(II), Rh(I), Ir(I), Pd(II) or Au(III), L* and L*' each, independently, represent a bidentate ligand or two mono-dentate ligands, s-bph and s'-bph each have an Ar—Ar group, where Ar represents an aromatic ring system, and n and m each represent an integer from 0 to 5, where at least one group M', L*', s'-bph has been modified to give the groups M, L* and s-bph.

29. The oligomer according to claim 23, wherein the M-M separation between two adjacent complexes in a stack is ≤0.37 nm.

30. A crystalline layer comprising oligomers according to claim 23.

31. The crystalline layer according to claim 30 having a charge-carrier mobility of ≥$10^{-3}$ cm$^2$/Vs.

* * * * *